(12) United States Patent
Mo et al.

(10) Patent No.: US 12,080,977 B2
(45) Date of Patent: Sep. 3, 2024

(54) SIGNAL TRANSMISSION DEVICE BASED ON MID/LDS TECHNOLOGY AND ASSEMBLY METHOD THEREOF

(71) Applicant: HANGZHOU MO-LINK TECHNOLOGY CO. LTD, Hangzhou (CN)

(72) Inventors: Cheng Zhi Mo, Hangzhou (CN); Qi Chen, Hangzhou (CN); Hao Wang, Hangzhou (CN); Fengfeng Yang, Hangzhou (CN)

(73) Assignee: HANGZHOU MO-LINK TECHNOLOGY CO. LTD, Hangzhou (CN)

( * ) Notice: Subject to any disclaimer, the term of this patent is extended or adjusted under 35 U.S.C. 154(b) by 184 days.

(21) Appl. No.: 17/701,837

(22) Filed: Mar. 23, 2022

(65) Prior Publication Data

US 2023/0088210 A1    Mar. 23, 2023

(30) Foreign Application Priority Data

Sep. 23, 2021   (CN) .......................... 202111117623.3

(51) Int. Cl.
*H01R 13/66*     (2006.01)
*G02B 6/42*      (2006.01)
(Continued)

(52) U.S. Cl.
CPC ......... *H01R 13/6691* (2013.01); *G02B 6/425* (2013.01); *H01R 13/50* (2013.01);
(Continued)

(58) Field of Classification Search
CPC ................ H01R 13/6691; H01R 13/50; H01R 13/6581; H01R 43/18; H01R 13/665; H01R 13/6658; G02B 6/425; G02B 6/423; G02B 6/4246; G02B 6/4249; G02B 6/428; H05K 2201/10121
See application file for complete search history.

(56) References Cited

U.S. PATENT DOCUMENTS

2017/0131490 A1*  5/2017  Jokura ................. G02B 6/4292
2021/0226363 A1*  7/2021  Hikosaka ............. G02B 6/4292

FOREIGN PATENT DOCUMENTS

CN          107277306 A  * 10/2017  .......... G02B 27/646

* cited by examiner

*Primary Examiner* — Justin M Kratt
(74) *Attorney, Agent, or Firm* — Li & Cai Intellectual Property (USA) Office

(57) ABSTRACT

The present disclosure describes a signal transmission device based on molded interconnect device and laser direct structuring (MID/LDS) technology, comprising: a shielding shell (1); and a photoelectric conversion module (2), which includes a carrier (21), an electrical module (22) and an optical module (23). The photoelectric conversion module (2) is fixed inside the shielding shell (1), wherein the first recessed structure (201) accommodates a driving chip (211), a photoelectric conversion chip (212) and an optical module (23), and the second recessed structure (202) accommodates an electrical module (22), the driving chip (211), the photoelectric conversion chip (212) and the conductive terminal (215) are electrically connected to each other, and the carrier (21) is designed by integral molding based on the MID/LDS technology. In t present disclosure, the design space in the shielding shell can be effectively saved.

6 Claims, 10 Drawing Sheets

(51) Int. Cl.
*H01R 13/50* (2006.01)
*H01R 13/6581* (2011.01)
*H01R 43/18* (2006.01)

(52) U.S. Cl.
CPC ......... *H01R 13/6581* (2013.01); *H01R 43/18* (2013.01); *G02B 6/423* (2013.01); *G02B 6/4246* (2013.01); *G02B 6/4249* (2013.01); *G02B 6/428* (2013.01); *H01R 13/665* (2013.01); *H01R 13/6658* (2013.01); *H05K 2201/10121* (2013.01)

SIGNAL TRANSMISSION DEVICE BASED ON MID/LDS TECHNOLOGY AND ASSEMBLY METHOD THEREOF

FIELD OF THE DISCLOSURE

The present disclosure relates to a signal transmission device based on molded interconnect device and laser direct structuring (MID/LDS) technology and an assembly method thereof.

BACKGROUND OF THE DISCLOSURE

In the field of computer data transmission technology, regarding various electronic devices such as notebook computers and various types of connectors, internal units of electronic devices and various peripheral connectors are designed with data transmission modules to realize video display, data acquisition, file transfer and other functions, such as the more commonly used HDMI connector.

As the requirements for miniaturization, low cost and multi-functionality of electronic equipment become higher, the requirements for the space inside the connector and the size and cost of each working module also become higher. The requirements for circuit boards or carriers are correspondingly higher.

In the prior art, a PCB circuit board is usually used inside the connector to realize the circuit connection of each working module or to carry each working module to realize signal transmission. However, the design of the circuit board and its circuit layout are limited in space, and the production cycle is also longer.

SUMMARY OF THE DISCLOSURE

The present disclosure is proposed in view of the above-mentioned state of the prior art, and an object of the present disclosure is to provide a signal transmission device based on molded interconnect device and laser direct structuring (MID/LDS) technology and an method of assembling a signal transmission device based on MID/LDS technology that can effectively save design space.

Therefore, a signal transmission device based on MID/LDS technology is provide, including: a shielding shell (1), of which two sides are respectively provided with a first buckle (11) and a second buckle (12); and a photoelectric conversion module (2), comprising a carrier (21), an electrical module (22) and an optical module (23), wherein a first surface (26) of the carrier (21) is provided with an optical module (23), a second surface (27) of the carrier (21) is provided with an electrical module (22), and two side surfaces of the carrier (21) are respectively provided with a first card slot (24) and a second card slot (25), and wherein the first buckle (11) is buckled into the first card slot (24), and the second buckle (12) is buckled into the second card slot (25), so that the photoelectric conversion module (2) is fixed in the shielding shell (1), and wherein, the carrier (21) comprises a first connection end (28) and a second connection end (29), the first surface (26) is a first recessed structure (201) at the second connection end (29), the second surface (27) is a second recessed structure (202) at the second connection end (29), wherein a driving chip (211), a photoelectric conversion chip (212) and the optical module (23) are accommodated in the first recessed structure (201), the electrical module (22) is accommodated in the second recessed structure (202), a conductive terminal (215) is provided at the first connection end (28) of the carrier (21), the driving chip (211) and the photoelectric conversion chip (212) are fixed on the first surface (26) of the carrier (21), the driving chip (211), the photoelectric conversion chip (212) and the conductive terminal (215) are electrically connected to each other, and the carrier (21) is integrally formed based on MID/LDS technology.

In the first aspect of the present disclosure, the carrier (21) is designed by integral molding through MID/LDS technology, and an optical module (23), a driving chip (211) and a photoelectric conversion chip (212) are arranged at the first recessed structure (201) of the carrier (21), an electrical module (22) is provided at the second recessed structure (202) of the carrier (21), and the carrier (21) is then fixed in the shielding shell (1) through buckles and card slots. In this case, through the spatial arrangement of the working modules on the carrier (21), the surface space of the carrier (21) can be effectively utilized, and the space in the shielding shell can be effectively saved.

In addition, in the signal transmission device according to the first aspect of the present disclosure, optionally, a positioning hole (214) is arranged on the first surface of the carrier (21), the second surface is provided with a conductive silica gel hole (213). Therefore, it is convenient for the carrier to be connected to other components through holes.

In addition, in the signal transmission device according to the first aspect of the present disclosure, optionally, the electrical module (22) includes a copper wire (221), an electronic component (222), and an electronic component carrier (223); wherein a conductive sheet (2221) is printed on the electronic component (222), the copper wire (221), the electronic component (222), the conductive sheet (2221) and the conductive terminal (215) are electrically connected in sequence, the electronic component (222) is fixed on the electronic component carrier (223), and the electronic component carrier (223) fixes the electrical module (22) in the second recessed structure (202) of the carrier (21) by connecting the conductive silica gel hole (213). Therefore, on the one hand, it is convenient for the electrical module to realize its electrical conduction, and on the other hand, it is convenient for the electrical module to be fixed on the carrier.

In addition, in the signal transmission device according to the first aspect of the present disclosure, optionally, the optical module (23) includes a lens module (231), an optical fiber carrier (232) and an optical fiber (233); the optical fiber carrier (232) is fixedly connected to the lens module (231), and the optical fiber carrier (232) is used to fix the optical fiber (233). In this way, it is convenient for the optical module to realize its light transmission.

In addition, in the signal transmission device according to the first aspect of the present disclosure, optionally, a positioning column (2311) is provided on the lens module (231), and the optical module (23) is fixed in the first recessed structure (201) of the carrier (21) by inserting the positioning column (2311) into the positioning hole (214). Therefore, the optical module can be easily fixed on the carrier.

In addition, in the signal transmission device according to the first aspect of the present disclosure, optionally, the positioning column (2311) includes a first positioning column (2311a) and a second positioning column (2311b), and the positioning hole (214) includes a first positioning hole (214a) and a second positioning hole (214b), and the optical module (23) is fixed in the first recessed structure (201) of the carrier (21) by inserting the first positioning column (2311a) into the first positioning hole (214a) and inserting the second positioning column (2311b) into the second positioning hole (214b). Therefore, it is more convenient to fix the optical module on the carrier.

In addition, in the signal transmission device according to the first aspect of the present disclosure, optionally, the conductive terminal (215) includes a first conductive terminal (215a) and a second conductive terminal (215b), the first conductive terminal (215a) and the second conductive terminal (215b) are provided on the carrier (21), and a plug cavity is formed between the first conductive terminal (215a) and the second conductive terminal (215b). Therefore, it is convenient for the carrier to conduct electrical conduction at the first connection end (28).

In addition, in the signal transmission device according to the first aspect of the present disclosure, optionally, it further includes: a sleeve (3), a sealing cover (4) and a wire sleeve (5), wherein the sleeve (3) is sleeved outside the shielding shell (1), and the sealing cover (4) is used to seal a connection between the photoelectric conversion module (2) and the wire sleeve (5). Therefore, a complete signal transmission device can be formed.

In the second aspect of the present disclosure, a method of assembling a signal transmission device based on molded interconnect device and laser direct structuring (MID/LDS) technology is provided, including: fixing an optical fiber (233) in an optical fiber carrier (232), and fixedly connecting the optical fiber carrier (232) with a lens module (231); fixing a driving chip (211) and a photoelectric conversion chip (212) on a first surface (26) of a carrier (21); aligning the lens module (231) with the photoelectric conversion chip (212) on the carrier (21), and fixing the optical module (23) in a first recessed structure (201) of the carrier (21) through a positioning hole (214) and a positioning column (2311); fixing an electrical module (22) in a second recessed structure (202) of the carrier (21) by connecting a conductive silica gel hole (213); and fixing the carrier (21) in a shielding shell (1).

In the second aspect of the present disclosure, the driving chip, the photoelectric conversion chip, the optical module, and the electrical module are successively arranged on the carrier (the assembly order of the electrical modules is not fixed), and then the carrier is fixed on the shielding shell, thereby assembling the signal transmission device. In this case, the signal transmission device can be easily assembled, and the assembly process is simple and easy to operate.

In addition, in the signal transmission device according to the second aspect of the present disclosure, optionally, the shielding shell (1) includes a first buckle (11) and a second buckle (12) arranged on two sides thereof, the carrier (21) includes a first card slot (24) and a second card slot (25) arranged on two sides of the carrier (21), and the first buckle (11) is buckled into the first card slot (24) and a second buckle (12) is buckled into the second card slot (25) so that the photoelectric conversion module (2) is fixed in the shielding shell (1). Therefore, the photoelectric conversion module can be more conveniently fixed in the shielding shell.

In the first aspect of the present disclosure, the carrier (21) is designed by integral molding through MID/LDS technology. An optical module (23), a driving chip (211) and a photoelectric conversion chip (212) are arranged at the first recessed structure (201) of the carrier (21), an electrical module (22) is provided at the second recessed structure (202) of the carrier (21), and the carrier (21) is then fixed in the shielding shell (1) by means of buckles and card slots. In this case, the surface space of the carrier (21) can be effectively utilized, and the space in the shielding shell can be effectively saved through the spatial arrangement of the working modules on the carrier (21).

BRIEF DESCRIPTION OF THE DRAWINGS

Embodiments of the present disclosure will now be explained in further detail by way of example only with reference to the accompanying drawings.

Figure 1:
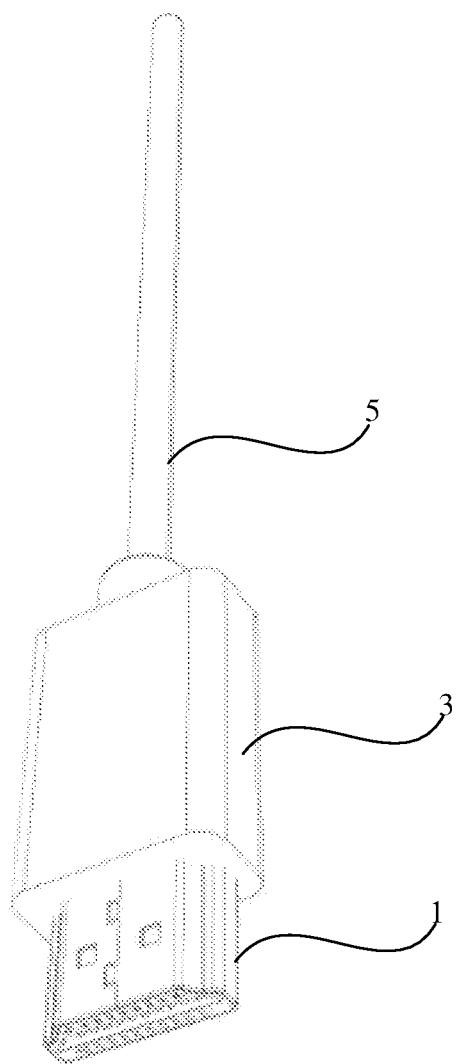
FIG. 1 is a schematic diagram showing the overall structure of the photoelectric conversion device according to an embodiment of the present disclosure.

Reference numeral: 1. shielding shell, 2. photoelectric conversion module, 3. sleeve, 4. sealing cover, 5. wire sleeve, 11. first buckle, 12. second buckle, 21. carrier, 22. electrical module, 23. optical module, 24. first card slot, 25. second card slot, 26. first surface, 27. second surface, 201. first recessed structure, 202. second recessed structure, 211. driving chip, 212. photoelectric conversion chip, 213. conductive silicone hole, 214. positioning hole, 215. conductive terminal, 221. copper wire, 222. electronic component, 223. electronic component carrier, 2221. conductive sheet, 231. lens module, 232. fiber carrier, 233. optical fiber, 2311. positioning column.

DETAILED DESCRIPTION OF THE EXEMPLARY EMBODIMENTS

Hereinafter, preferred embodiments of the present disclosure will be described in detail with reference to the accompanying drawings. In the following description, the same reference numerals are assigned to the same components, and overlapping descriptions are omitted. In addition, the drawings are only schematic diagrams, and the ratios of the dimensions of the members, the shapes of the members, and the like may be different from the actual ones.

Figure 2:
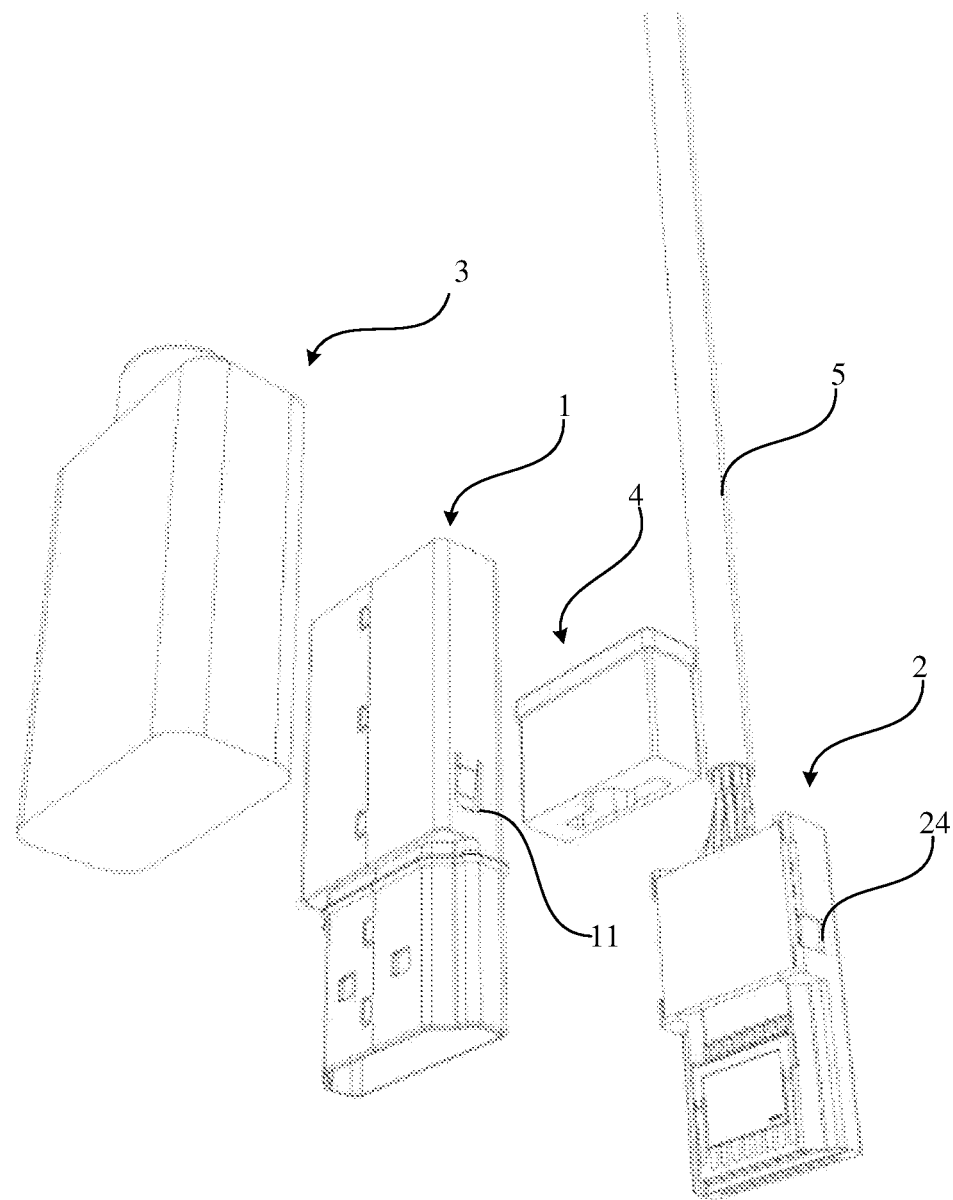
FIG. 2 is an exploded view of FIG. 1.
Figure 3:
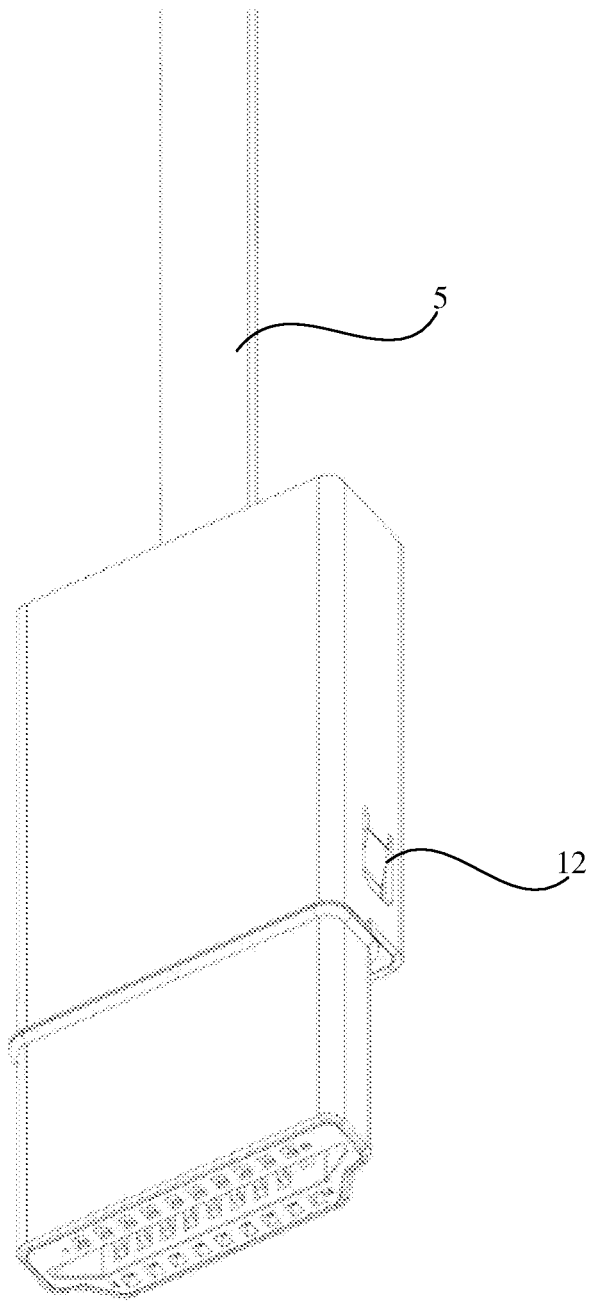
FIG. 3 is a schematic structural diagram showing an example of the photoelectric conversion device according to an embodiment of the present disclosure.

FIG. 1 is a schematic diagram showing the overall structure of the photoelectric conversion device according to an embodiment of the present disclosure. FIG. 2 is an exploded view of FIG. 1. FIG. 3 is a schematic structural diagram showing an example of the photoelectric conversion device according to an embodiment of the present disclosure.

Reference is made to FIG. 1 to FIG. 3. The signal transmission device based on the MID/LDS technology involved in this embodiment (hereinafter referred to as the signal transmission device) may include a shielding case 1 and a photoelectric conversion module 2, and the photoelectric conversion module 2 may be fixed in the shielding case 1 (refer to FIG. 3).

In other examples, the signal transmission device may also include a sleeve 3, a sealing cover 4 and a wire sleeve 5. The sleeve 3 can be sleeved outside the shielding shell 1; the sealing cover 4 can be used to seal the connection between the photoelectric conversion module 2 and the wire sleeve 5 to prevent the wire from being exposed (the wire sleeve 5 can be used to wrap the copper wire 221 and the optical fiber 233 described later).

It can be understood that the signal transmission device may be the signal transmission device as shown in FIG. 1, and the signal transmission device may be used to connect electronic devices such as circuit boards to realize signal transmission. The signal transmission device may include a shielding shell 1, a photoelectric conversion module 2, a sleeve 3, a sealing cover 4 and a wire sleeve 5. One end of the photoelectric conversion module 2 can be used to connect electronic equipment such as circuit boards and computers, and the other end of the photoelectric conversion module 2 can be used to connect the cable sleeve 5.

In this embodiment, a first buckle 11 and a second buckle 12 may be respectively provided on two sides of the shielding shell 1. Correspondingly, two side surfaces of the photoelectric conversion module 2 may be respectively provided with a first card slot 24 and a second card slot 25 that are respectively adapted to the first buckle 11 and the second buckle 12 (refer to FIG. 2 and FIG. 3). In this case, it is convenient for the photoelectric conversion module 2 to be fixedly connected to the shielding shell 1, and the photoelectric conversion module 2 can be fixed in the shielding shell 1.

Figure 4:
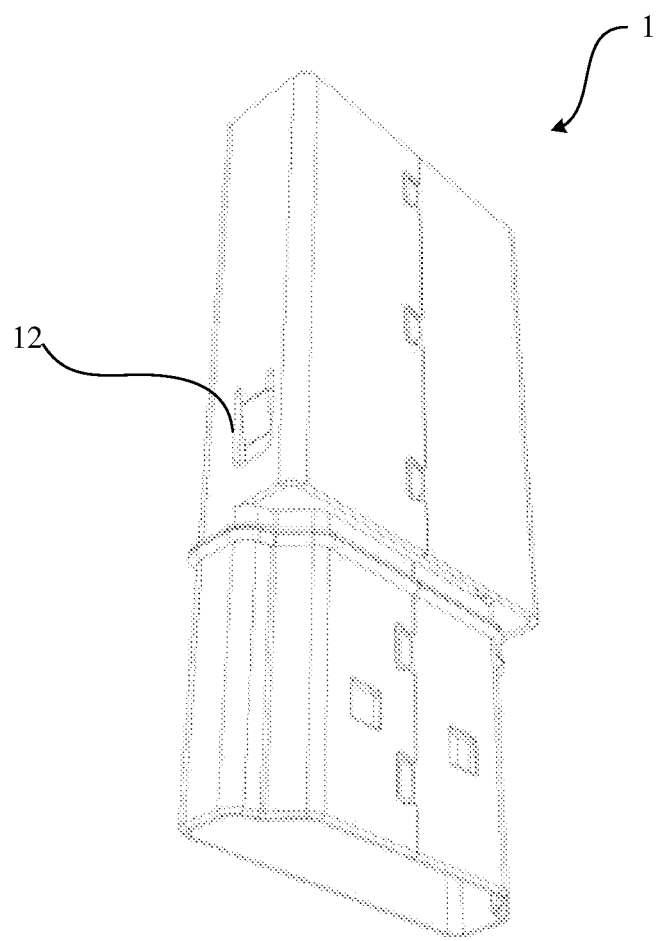
FIG. 4 is a schematic structural diagram showing the shielding shell of the photoelectric conversion device according to an embodiment of the present disclosure.
Figure 5:
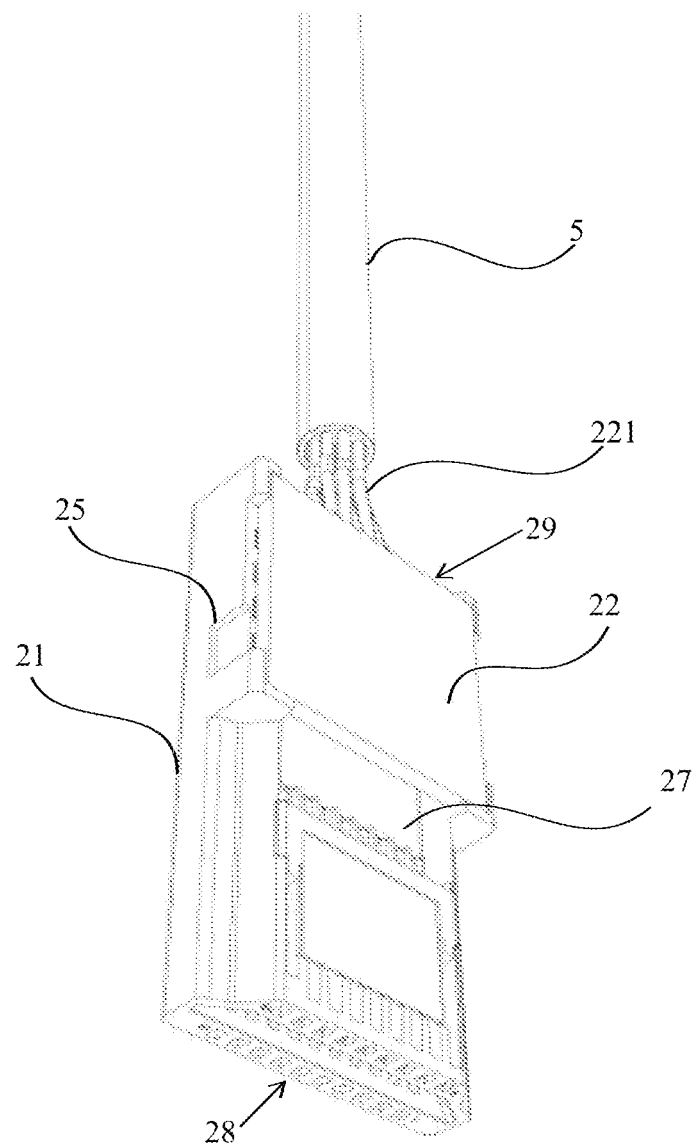
FIG. 5 is a schematic structural diagram showing the photoelectric conversion module of the photoelectric conversion device according to an embodiment of the present disclosure.
Figure 6:
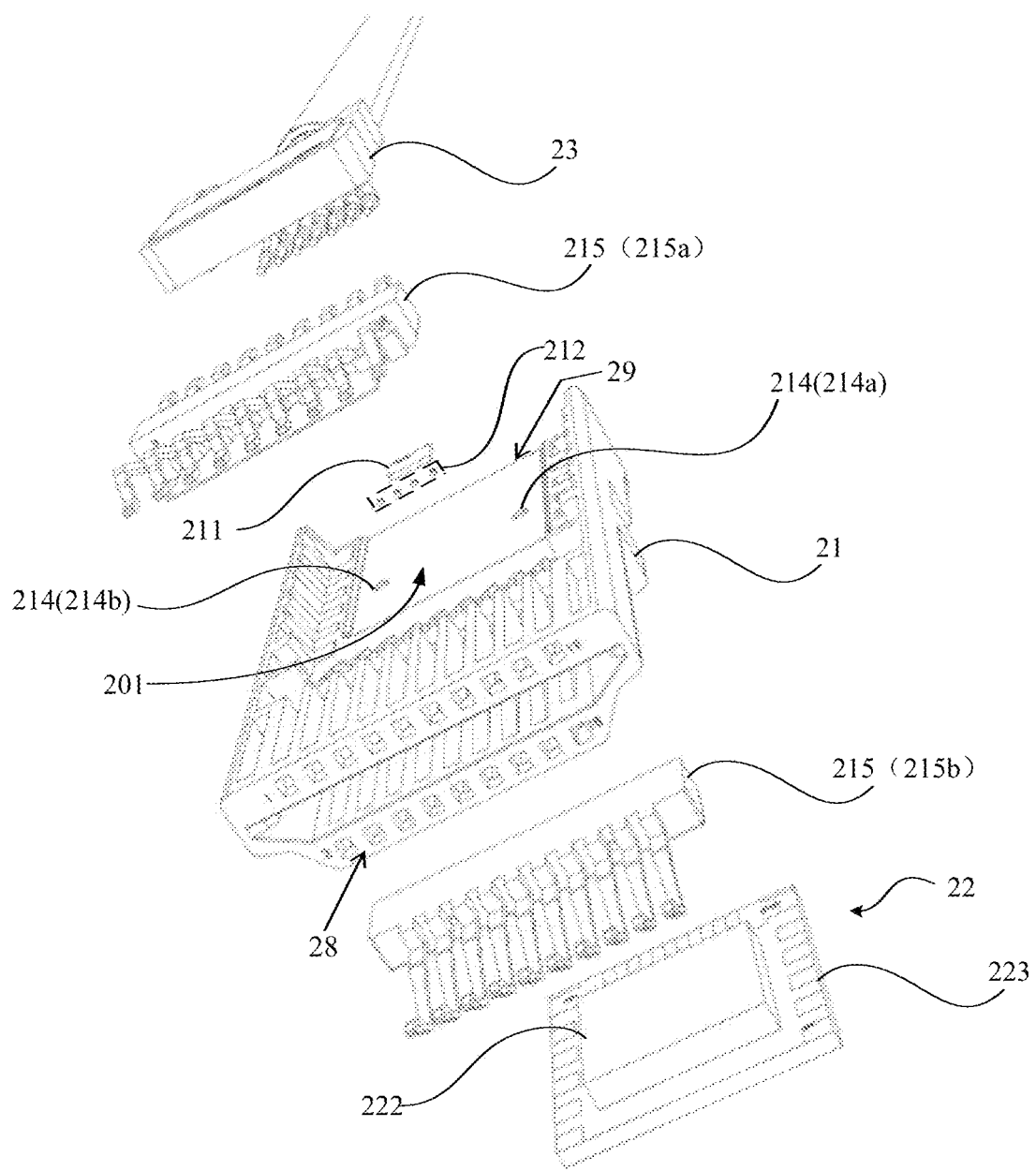
FIG. 6 is an exploded view of FIG. 4.

FIG. 4 is a schematic structural diagram showing the shielding shell of the photoelectric conversion device according to an embodiment of the present disclosure. FIG. 5 is a schematic structural diagram showing the photoelectric conversion module of the photoelectric conversion device according to an embodiment of the present disclosure. FIG. 6 is an exploded view of FIG. 4.

Reference is made to FIGS. 4 to 6. In this embodiment, the photoelectric conversion module 2 may include a carrier 21, an electrical module 22 and an optical module 23. The first surface 26 of the carrier 21 may be provided with an optical module 23, the second surface 27 of the carrier 21 may be provided with an electrical module 22, and two side surfaces of the carrier 21 may be provided with a first card slot 24 and a second card slot 25 respectively.

In addition, in this embodiment, the carrier 21 may include a first connection end (28) and a second connection end (29), the first surface 26 may be a first recessed structure 201 at the second connection end (29), and the second surface 27 may be a second recessed structure 202 at the second connection end (29). The first recessed structure 201 can accommodate the driving chip 211, the photoelectric conversion chip 212 and the optical module 23, and the second recessed structure 202 can accommodate the electrical module 22. A conductive terminal 215 is provided at the first connection end (28) of the carrier 21.

In this embodiment, the carrier 21 can be integrally formed, and the carrier 21 can be used to carry the electrical module 22 and the optical module 23. In some examples, the carrier 21 may also be used to carry the driving chip 211, the photoelectric conversion chip 212 and the conductive terminal 215 (described in detail later).

The carrier 21 can be designed by integral molding through MID/LDS technology. The optical module 23, the driving chip 211 and the photoelectric conversion chip 212 can be provided at the first recessed structure 201 of the carrier 21 and an electrical module 22 may be disposed at the second recessed structure 202 of the carrier 21, so that the carrier 21 is fixed in the shielding shell 1 by means of buckles and card slots. In this case, the surface space of the carrier 21 can be effectively utilized, and the space in the shielding shell can be effectively saved through the spatial arrangement of the above working modules on the carrier 21.

In some examples, the material of the carrier 21 may be polymer synthetic resin, plastic, or the like. In other examples, the carrier 21 may be a molded plastic that has passed the RoHS certification (the Restriction of the use of certain hazardous substances in electrical and electronic equipment, "Directive on the Restriction of the Use of Certain Hazardous Substances in Electrical and Electronic Equipment").

In some examples, the photoelectric conversion module 2 can be fixed in the shielding shell 1 by bucking the first buckle 11 into the first card slot 24 and the second buckle 12 into the second card slot 25. Thereby, the photoelectric conversion module 2 can be stably fixed in the shielding shell 1.

In this embodiment, the photoelectric conversion module 2 can realize the conversion and transmission of photoelectric information. Specifically, the photoelectric conversion module 2 may include a first connection end and a second connection end (the first connection end and the second connection end of the photoelectric conversion module 2 may be the first connection end (28) and the second connection end (29) of the carrier 21), the first connection end can be connected with electronic devices such as peripheral circuit boards, and the second connection end can be connected with the wire sleeve 5. Electronic devices such as circuit boards can transmit electrical signals to the photoelectric conversion module 2 through the first connection end of the photoelectric conversion module 2, and the electrical signals can be converted into optical signals in the photoelectric conversion module 2 and transmitted to the wire sleeve 5. The wire sleeve 5 performs long-distance transmission of optical signals. The optical signal in the wire sleeve 5 can be transmitted to the photoelectric conversion module 2 through the second connection end, and the photoelectric conversion module 2 converts the optical signal into an electrical signal, and the electrical signal is then transmitted to peripheral electronic devices such as circuit boards through the first connection terminal.

Figure 7:
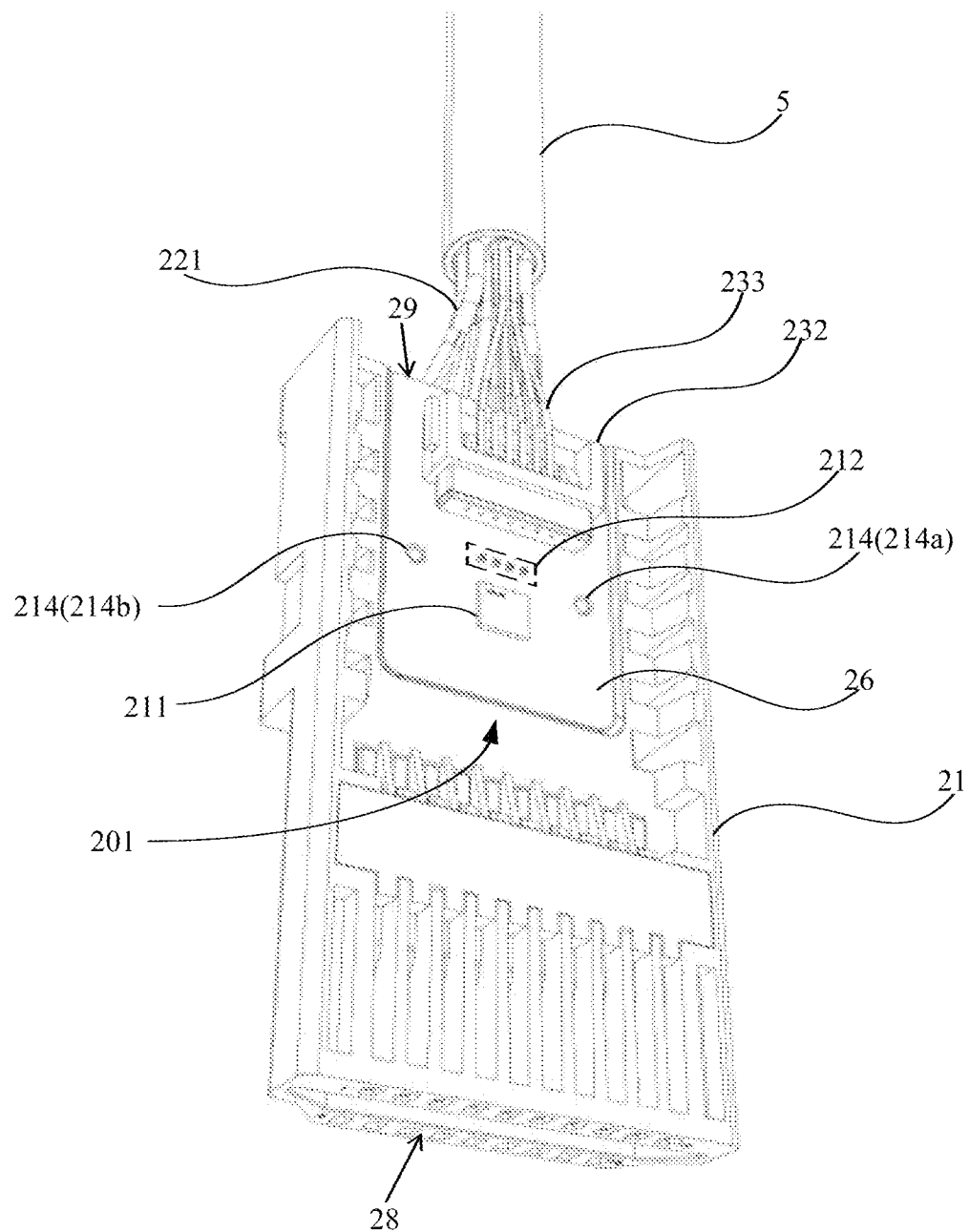
FIG. 7 is a schematic structural diagram showing an example of the photoelectric conversion device according to an embodiment of the present disclosure.
Figure 8:
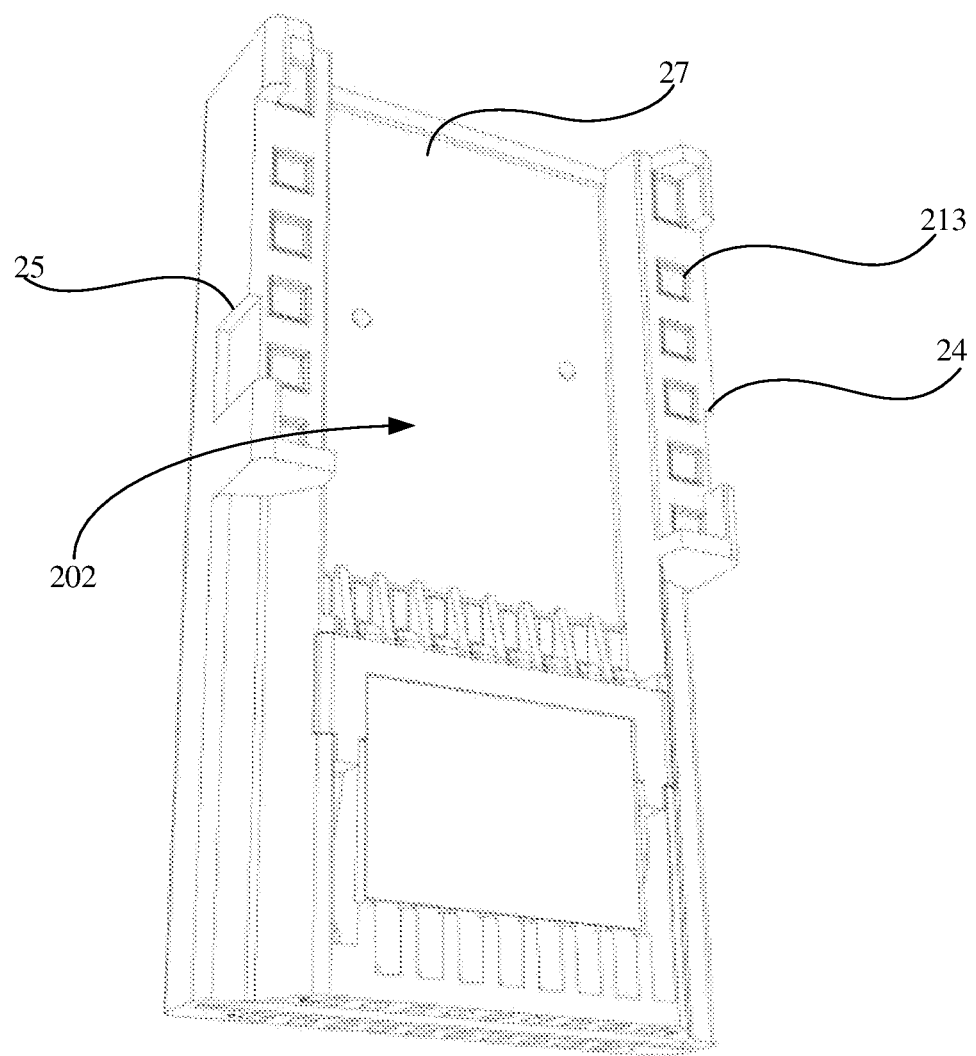
FIG. 8 is a schematic structural diagram showing the carrier of the photoelectric conversion device according to an embodiment of the present disclosure.

FIG. 7 is a schematic structural diagram showing an example of the photoelectric conversion device according to an embodiment of the present disclosure. FIG. 8 is a schematic structural diagram showing the carrier of the photoelectric conversion device according to an embodiment of the present disclosure.

Reference is made to FIGS. 7 and 8. In this embodiment, the carrier 21 may include a first connection end (28) and a second connection end (29), the first surface 26 may be a first recessed structure 201 at the second connection end (29), and the second surface 27 may be a second recessed structure 202 at the second connection end (29). A driving chip 211, a photoelectric conversion chip 212 and a conductive terminal 215 may be disposed on the carrier 21. The driving chip 211 and the photoelectric conversion chip 212 can be fixed on the carrier 21, and the driving chip 211, the photoelectric conversion chip 212 and the conductive terminal 215 can be electrically connected to each other to transmit electrical signals. The carrier 21 can be integrally formed based on the MID/LDS technology.

In some examples, the driving chip 211 and the photoelectric conversion chip 212 may be fixed to the first surface 26 of the carrier 21. In some examples, the driving chip 211 and the photoelectric conversion chip 212 may be fixed to the first surface 26 of the carrier 21 using glue, tape, or the like (refer to FIG. 7). Thus, the driving chip 211 and the photoelectric conversion chip 212 can be stably fixed on the first surface 26 of the carrier 21.

Reference is again made to FIG. 6. In some examples, the conductive terminal 215 may include a first conductive terminal 215a and a second conductive terminal 215b, the first conductive terminal 215a may be disposed on the first surface 26 of the carrier 21, and the second conductive terminal 215b may be disposed on the second surface 27 of the carrier 21. The first conductive terminal 215a and the second conductive terminal 215b may be disposed on the first connection end (28) of the carrier 21. A plug cavity may be formed between the first conductive terminal 215a and the second conductive terminal 215b. In this case, the plug cavity is used as the first connection end of the carrier 21, which can facilitate the connection of the carrier 21 with electronic devices such as circuit boards through the plug cavity and conduct signal conduction.

In some examples, the first conductive terminal 215 a may be embedded in the first connection end (28) of the first surface 26 of the carrier 21, and the second conductive terminal 215b may be embedded in the first connection end (28) of the second surface 27 of the carrier 21. Therefore, it is convenient to fix the first conductive terminal 215a and the second conductive terminal 215b on the first connection end (28) of the carrier 21.

In this embodiment, the positioning hole 214 may be formed on the first surface 26 of the carrier 21, and the conductive silicone hole 213 may be formed on the second surface 27 of the carrier 21. Therefore, it is convenient for the carrier to be connected to other components through holes.

Specifically, referring to FIG. 7, the first positioning hole 214a and the second positioning hole 214 b may be respectively arranged on the left and right sides of the first surface 26 of the carrier 21.

Specifically, referring to FIG. 8, a plurality of conductive silica gel holes 213 may be respectively arranged on the left and right sides of the second surface 27 of the carrier 21. In some examples, a number of 1, 2, 3, 4, 5, 6, 7, 8, 9 and 10 of conductive silicone holes 213 may be respectively arranged on the left and right sides of the second surface 27 of the carrier 21. In other examples, as shown in FIG. 8, five conductive silica gel holes 213 may be respectively arranged on the left and right sides of the second surface 27 of the carrier 21.

In some examples, the positioning hole 214 may partially penetrate the first surface 26 of the carrier 21. In other examples, the positioning hole 214 may penetrate the first surface 26 of the carrier 21 to the second surface 27.

Figure 9:
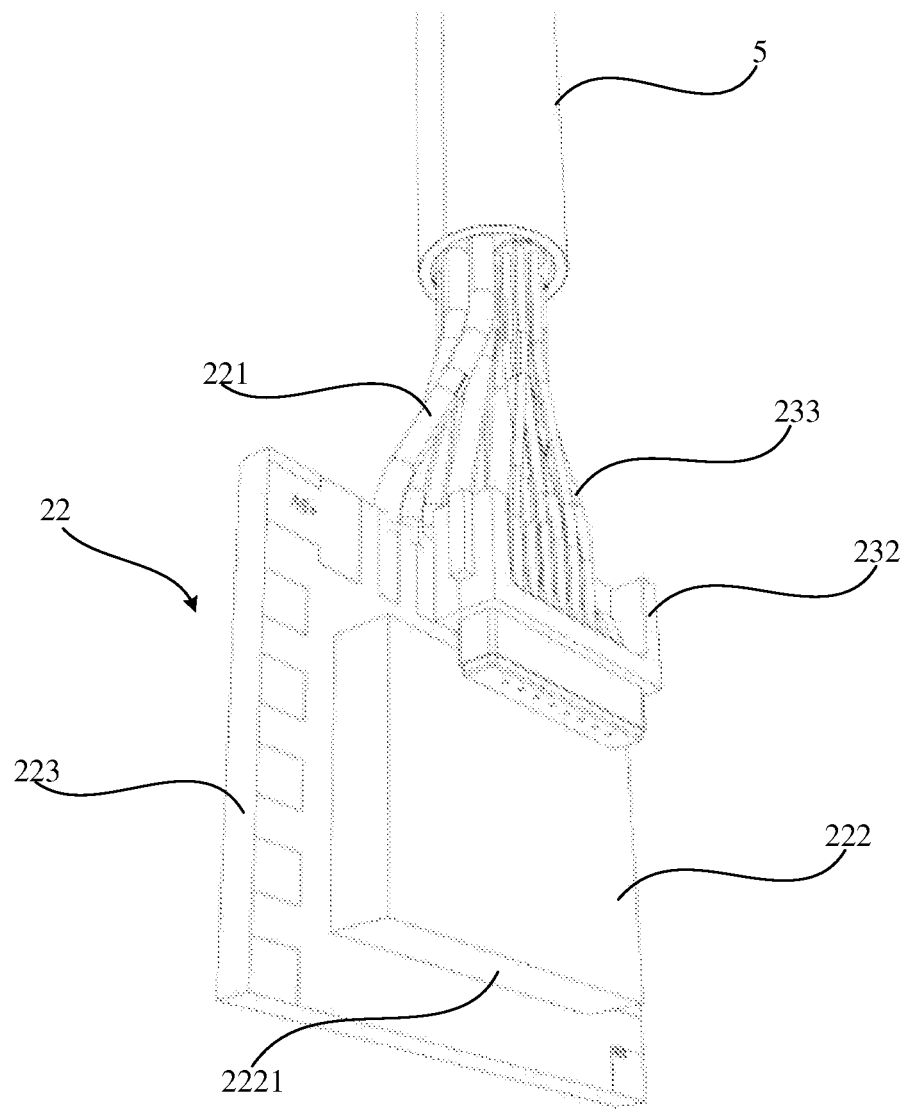
FIG. 9 is a schematic structural diagram showing another example of the photoelectric conversion device according to an embodiment of the present disclosure.
Figure 10:
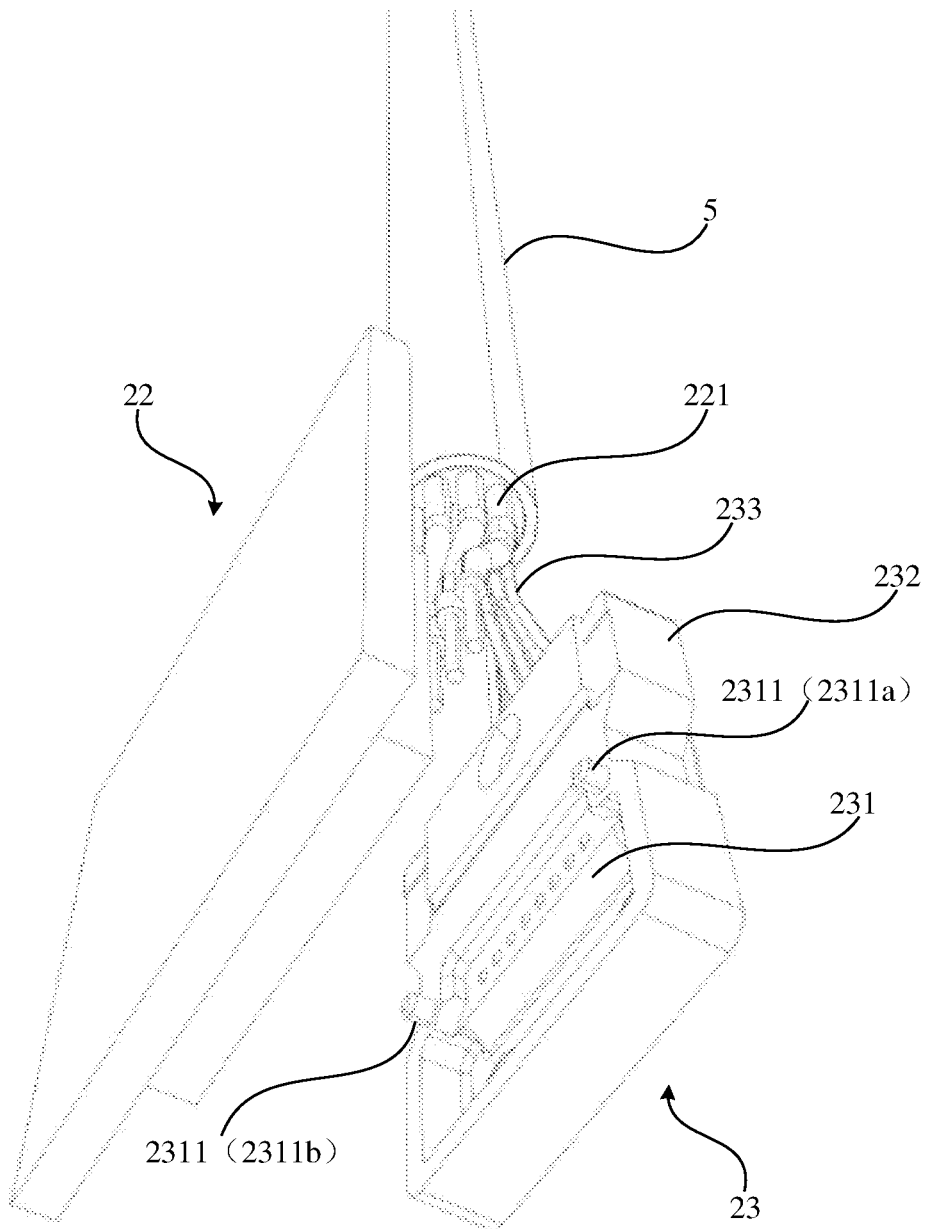
FIG. 10 is a schematic structural diagram showing still another example of the photoelectric conversion device according to an embodiment of the present disclosure.

FIG. 9 is a schematic structural diagram showing another example of the photoelectric conversion device according to an embodiment of the present disclosure. FIG. 10 is a schematic structural diagram showing still another example of the photoelectric conversion device according to an embodiment of the present disclosure.

Reference is made to FIG. 9. In this embodiment, the electrical module 22 may include a copper wire 221, an electronic component 222, and an electronic component carrier 223; wherein a conductive sheet 2221 is printed on the electronic component 222. Specifically, the copper wire 221, the electronic component 222, the conductive sheet 2221 and the conductive terminal 215 may be electrically connected in sequence. Specifically, the copper wire 221, the electronic element 222, the conductive sheet 2221 and the second conductive terminal 215b may be electrically connected in sequence. In this case, it is convenient for the electrical module to realize its electrical conduction function.

In some examples, the electronic component 222 may be fixed on the electronic component carrier 223, and the electronic component carrier 223 fixes the electrical module 22 in the second recessed structure 202 of the carrier 21 by connecting the conductive silica gel hole 213. In this case, it is convenient to fix the electrical module 22 in the second recessed structure 202 of the carrier 21.

Reference is made to FIG. 10. In this embodiment, the optical module 23 may include a lens module 231, an optical fiber carrier 232 and an optical fiber 233. The optical fiber carrier 232 can be fixedly connected with the lens module 231, and the optical fiber carrier 232 can be used to fix the optical fiber 233. Therefore, the light transmission of the optical module 23 can be facilitated.

In this embodiment, the lens module 231 may be provided with a positioning column 2311, and the optical module 23 is fixed on the carrier 21 by inserting the positioning column 2311 into the positioning hole 214. Therefore, it is convenient to fix the optical module 23 in the first recessed structure 201 of the carrier 21.

In some examples, a first positioning column 2311a and a second positioning column 2311b respectively corresponding to the first positioning hole 214a and the second positioning hole 214b on the first surface 26 of the carrier 21 may be respectively provided on both sides of the surface of the lens module 231. The optical module 23 can be fixed in the first recessed structure 201 of the carrier 21 by inserting the first positioning column 2311a into the first positioning hole 214a and inserting the second positioning column 2311b into the second positioning hole 214b. In this case, the optical module 23 can be more stably fixed in the first recessed structure 201 of the carrier 21.

Further, when the optical module 23 is specifically connected with the carrier 21, after the lens module 231 is aligned with the photoelectric conversion chip 212 on the carrier 21, the optical module 23 is fixed on the carrier 21 through the positioning hole 214 and the positioning column 2311. The lens module 231 couples the light of the photoelectric conversion chip 212 into the optical fiber 233, or couples the light input from the optical fiber 233 into the photoelectric conversion chip 212, so as to realize the optical path alignment of the optical fiber 233 and the photoelectric conversion chip 212. Therefore, the conversion and transmission of the photoelectric signal can be conveniently completed.

In the present disclosure, the carrier 21 may be produced by using a molding interconnection device technology (Mechatronic Integrated Device, MID) and a laser direct structuring technology (LDS, Laser Direct Structuring).

Specifically, in this embodiment, the electronic components of the signal transmission device may mainly include an electrical module 22, an optical module 23, a driving chip 211, a photoelectric conversion chip 212 and a conductive terminal 215. In the design of the signal transmission device, the electrical module 22, the optical module 23, the driving chip 211, the photoelectric conversion chip 212, and the conductive terminal 215 can be integrated on the carrier 21 through the molding interconnection device technology.

Specifically, in this embodiment, the electrical module 22, the optical module 23, the driving chip 211, the photoelectric conversion chip 212, and the conductive terminal 215 on the carrier 21 can be interconnected by micro-circuits using the laser direct molding technology. Specifically, the optical module 23, the driving chip 211, the photoelectric conversion chip 212 and the first conductive terminal 215a can be connected on the carrier 21 by the LDS technology through micro-circuits, and the electrical module 22 can be connected to the second conductive terminal 215b on the carrier 21 through the conductive silica gel hole 213 and further connected by a micro-circuit through the LDS technology.

Reference is made to FIGS. 3-6. A method of assembling a signal transmission device based on molded interconnect device and laser direct structuring (MID/LDS) technology of the present disclosure may include:

Step 1: fixing an optical fiber 233 in an optical fiber carrier 232, and fixedly connecting the optical fiber carrier 232 with a lens module 231;

Step 2: fixing a driving chip 211 and a photoelectric conversion chip 212 on a carrier 21;

Step 3: aligning the lens module 231 with the photoelectric conversion chip 212 on the carrier 21, and fixing the optical module 23 in a first recessed structure 201 of the carrier 21 through a positioning hole 214 and a positioning column 2311, wherein the optical module 23 includes the lens module 231, the optical fiber carrier 232 and the optical fiber 233;

Step 4: fixing an electrical module 22 in a second recessed structure 202 of the carrier 21 by connecting a conductive silica gel hole 213; and Step 5: fixing the carrier 21 in a shielding shell 1. Specifically, the photoelectric conversion module 2 includes a carrier 21, an electrical module 22 and an optical module 23. The photoelectric conversion module 2 is fixed in the shielding shell 1 by buckling the first buckle 11 into the first card slot and buckling the second buckle 12 into the second card slot 25.

The driving chip 211, the photoelectric conversion chip 212, the optical module 23, and the electrical module 22 are successively arranged on the carrier 21 (the assembly order of the electrical module 22 may not be fixed), and then the carrier 21 is fixed on the shielding shell 1, thereby assembling the signal transmission device. In this case, the signal transmission device can be easily assembled, and the assembly process is simple and easy to operate.

It can be understood that the above assembly steps are not fixed. For example, in some examples, step 4 may precede step 1; in other examples, step 4 may also precede step 2 or step 3.

In some examples, step 6 may be included, where the sealing cover 4 is sleeved on the signal emitting end of the shielding shell 1 (i.e., the second connecting end of the photoelectric conversion module 2), and the sleeve 3 is sleeved outside the shielding shell 1. Thereby, it can be assembled as a complete signal transmission device.

Working principle: The first connection end of the signal transmission device (that is, the first connection end of the photoelectric conversion module 2) is connected with electronic devices such as peripheral circuit boards, and the circuit board can transmit electrical signals to the photoelectric conversion module 2. The electrical signal can be converted into an optical signal in the photoelectric conversion module 2 and transmitted to the wire cover 5, and the long-distance transmission of the optical signal is carried out by the wire cover 5. The second connection end of the signal transmission device can be connected to the wire sleeve 5, and the optical signal in the wire sleeve 5 can be transmitted to the photoelectric conversion module 2, then the photoelectric conversion module 2 converts the optical signal into an electrical signal, and the first connection end of the conversion module 2 transmits the electrical signal to peripheral electronic devices such as circuit boards.

In the present disclosure, the carrier 21 can be designed by integral molding through MID/LDS technology. An optical module 23, a driving chip 211 and a photoelectric conversion chip 212 can be provided at the first recessed structure 201 of the carrier 21, and an electrical module 22 may be provided at the second recessed structure 202 of the carrier 21, so that the carrier 21 is fixed in the shielding shell 1 by means of buckles and card slots. In this case, the surface space of the carrier 21 can be effectively utilized, and the space in the shielding shell 1 can be effectively saved through the spatial arrangement of the working modules on the carrier 21.

Although the present disclosure has been specifically described above with reference to the accompanying drawings and embodiments, it should be understood that the above description does not limit the present disclosure in any form. Those skilled in the art can make modifications and changes of the present disclosure as required without departing from the essential spirit and scope of the present disclosure, and these modifications and changes all fall within the scope of the present disclosure.

What is claimed is:

1. A signal transmission device based on molded interconnect device and laser direct structuring (MID/LDS) technology, comprising:
a shielding shell (1), of which two sides are respectively provided with a first buckle (11) and a second buckle (12); and
a photoelectric conversion module (2), including a carrier (21), an electrical module (22) and an optical module (23), wherein a first surface (26) of the carrier (21) is provided with the optical module (23), a second surface (27) of the carrier (21) is provided with the electrical module (22), and two side surfaces of the carrier (21) are respectively provided with a first card slot (24) and a second card slot (25), and wherein the first buckle (11) is buckled into the first card slot (24), and the second buckle (12) is buckled into the second card slot (25), so that the photoelectric conversion module (2) is fixed in the shielding shell (1), and
wherein, the carrier (21) comprises a first connection end (28) and a second connection end (29), the first surface (26) has a first recessed structure (201) at the second connection end (29), the second surface (27) has a second recessed structure (202) at the second connection end (29), wherein a driving chip (211), a photoelectric conversion chip (212) and the optical module (23) are accommodated in the first recessed structure (201), the electrical module (22) is accommodated in the second recessed structure (202), a conductive terminal (215) is provided at the first connection end (28) of the carrier (21), the driving chip (211) and the photoelectric conversion chip (212) are fixed on the first surface (26) of the carrier (21), the driving chip (211), the photoelectric conversion chip (212) and the conductive terminal (215) are electrically connected to each other, and the carrier (21) is integrally formed based on MID/LDS technology;

wherein a positioning hole (214) is arranged on the first surface (26) of the carrier (21), and a conductive silica gel hole (213) is arranged on the second surface (27) of the carrier (21);

wherein the electrical module (22) includes a copper wire (221), an electronic component (222), and an electronic component carrier (223); wherein a conductive sheet (2221) is printed on the electronic component (222), the copper wire (221), the electronic component (222), the conductive sheet (2221) and the conductive terminal (215) are electrically connected in sequence, the electronic component (222) is fixed on the electronic component carrier (223), and the electronic component carrier (223) fixes the electrical module (22) in the second recessed structure (202) of the carrier (21) by connecting to the conductive silica gel hole (213).

2. The signal transmission device based on MID/LDS technology according to claim 1, wherein the optical module (23) includes a lens module (231), an optical fiber carrier (232) and an optical fiber (233); wherein the optical fiber carrier (232) is fixedly connected to the lens module (231), and the optical fiber carrier (232) is used to fix the optical fiber (233).

3. The signal transmission device based on MID/LDS technology according to claim 2, wherein a positioning column (2311) is provided on the lens module (231), and the optical module (23) is fixed in the first recessed structure (201) of the carrier (21) by inserting the positioning column (2311) into the positioning hole (214).

4. The signal transmission device based on MID/LDS technology according to claim 3, wherein the positioning column (2311) includes a first positioning column (2311a) and a second positioning column (2311b), and the positioning hole (214) includes a first positioning hole (214a) and a second positioning hole (214b); wherein the optical module (23) is fixed in the first recessed structure (201) of the carrier (21) by inserting the first positioning column (2311a) into the first positioning hole (214a) and inserting the second positioning column (2311b) into the second positioning hole (214b).

5. The signal transmission device based on MID/LDS technology according to claim 1, wherein the conductive terminal (215) includes a first conductive terminal (215a) and a second conductive terminal (215b), the first conductive terminal (215a) and the second conductive terminal (215b) are provided on the first connection end (28) of the carrier (21), and a plug cavity is formed between the first conductive terminal (215a) and the second conductive terminal (215b).

6. The signal transmission device based on MID/LDS technology according to claim 1, further comprising: a sleeve (3), a sealing cover (4) and a wire sleeve (5), wherein the sleeve (3) is sleeved outside the shielding shell (1), and the sealing cover (4) is used to seal a connection between the photoelectric conversion module (2) and the wire sleeve (5).

* * * * *